(12) United States Patent
Liang

(10) Patent No.: US 7,102,894 B1
(45) Date of Patent: Sep. 5, 2006

(54) CIRCUIT BOARD SECURING DEVICE FOR COMPUTER CASE

(75) Inventor: Chien-Fa Liang, Chung-Ho (TW)

(73) Assignee: Super Micro Computer, Inc., San Jose, CA (US)

( * ) Notice: Subject to any disclaimer, the term of this patent is extended or adjusted under 35 U.S.C. 154(b) by 0 days.

(21) Appl. No.: 11/249,461

(22) Filed: Oct. 14, 2005

(51) Int. Cl.
*H05K 7/18* (2006.01)
*H01R 13/62* (2006.01)

(52) U.S. Cl. .................................. 361/801; 439/325
(58) Field of Classification Search ................ 361/730, 361/752, 796, 797, 803, 810, 756, 767, 825, 361/829, 740, 759, 754, 798, 801; 439/325
See application file for complete search history.

(56) References Cited

U.S. PATENT DOCUMENTS

| | | | |
|---|---|---|---|
| 5,124,886 A * | 6/1992 | Golobay ..................... 361/727 |
| 6,362,975 B1 * | 3/2002 | Liu et al. ..................... 361/796 |
| 6,385,036 B1 * | 5/2002 | Chien ......................... 361/683 |
| 6,487,089 B1 * | 11/2002 | Otis ............................. 361/796 |
| 6,580,616 B1 * | 6/2003 | Greenside et al. .......... 361/752 |
| 6,744,633 B1 * | 6/2004 | Dials et al. ................. 361/752 |
| 6,950,313 B1 * | 9/2005 | Shih ............................ 361/759 |

* cited by examiner

*Primary Examiner*—Kamand Cuneo
*Assistant Examiner*—Hung Thanh Nguyen
(74) *Attorney, Agent, or Firm*—Troxell Law Office, PLLC

(57) ABSTRACT

A circuit board securing device for a computer case includes a computer case, on a base panel of which are separately disposed vertical protruding beams. An elastic leaf is affixed to a side wall surface of each of the protruding beams. An end portion of each of the elastic leaves forms a vertical top abutting wall, a front portion of which is configured with a raising member. A rear abutting wall is formed on a side of the top abutting wall, and a clamping groove is formed between the top abutting wall and the rear abutting wall. Protruding holding bodies, between which are defined securing grooves, are formed on the base panel, and an opening of each of the securing grooves corresponds to an opening of each of the clamping grooves, thereby securing a circuit board without applying screws, enabling fast clamping and disassembling of the circuit board.

4 Claims, 5 Drawing Sheets

CIRCUIT BOARD SECURING DEVICE FOR COMPUTER CASE

BACKGROUND OF THE INVENTION (a) Field of the Invention

The present invention relates to a circuit board securing device for a computer case, and more particularly to a securing device that completely eliminates the need for screws to screw down a circuit board to a computer case, and enables convenient and fast clamping and disassembling of the circuit board.

(b) Description of the Prior Art

Internal circuit boards of all conventional computer cases are secured to a base panel by a screw means whereby screws are used to screw down the circuit board when assembling and the screws are unscrewed to disassemble the circuit board, which is extremely inconvenient in operation.

Moreover, screw holes must be drilled into the circuit board and the base panel one after another, which results in high processing costs.

Hence, subject of the present invention is to resolve and surmount existent technical difficulties to design a securing device that completely eliminates the need for screws to screw down a circuit board inside a computer case.

SUMMARY OF THE INVENTION

An object of the present invention is to provide a circuit board securing device for a computer case that eliminates the need for screws to secure a circuit board, and which enables fast clamping and disassembling of the circuit board.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
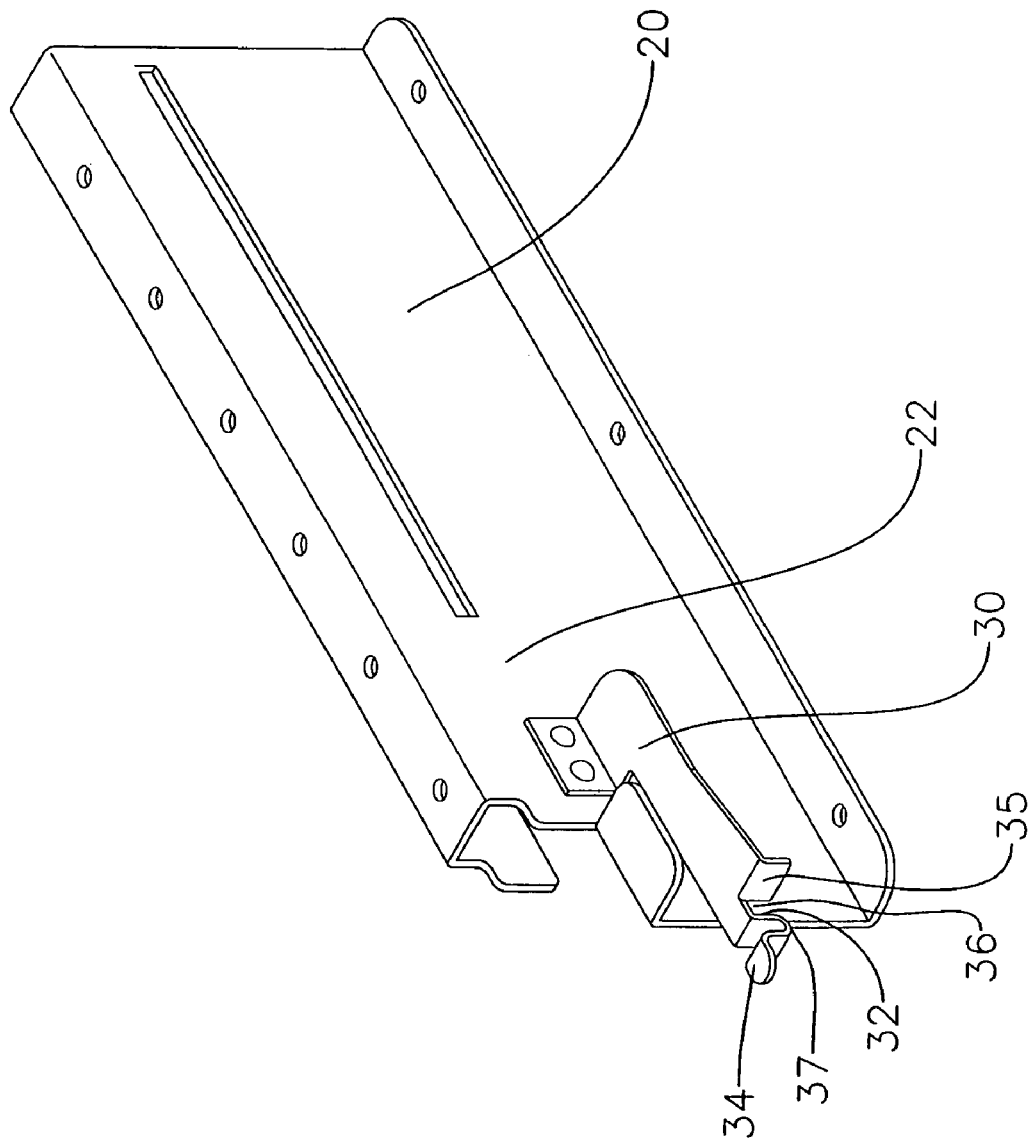
FIG. 1 shows an elevational view of a protruding beam according to the present invention.
Figure 2:
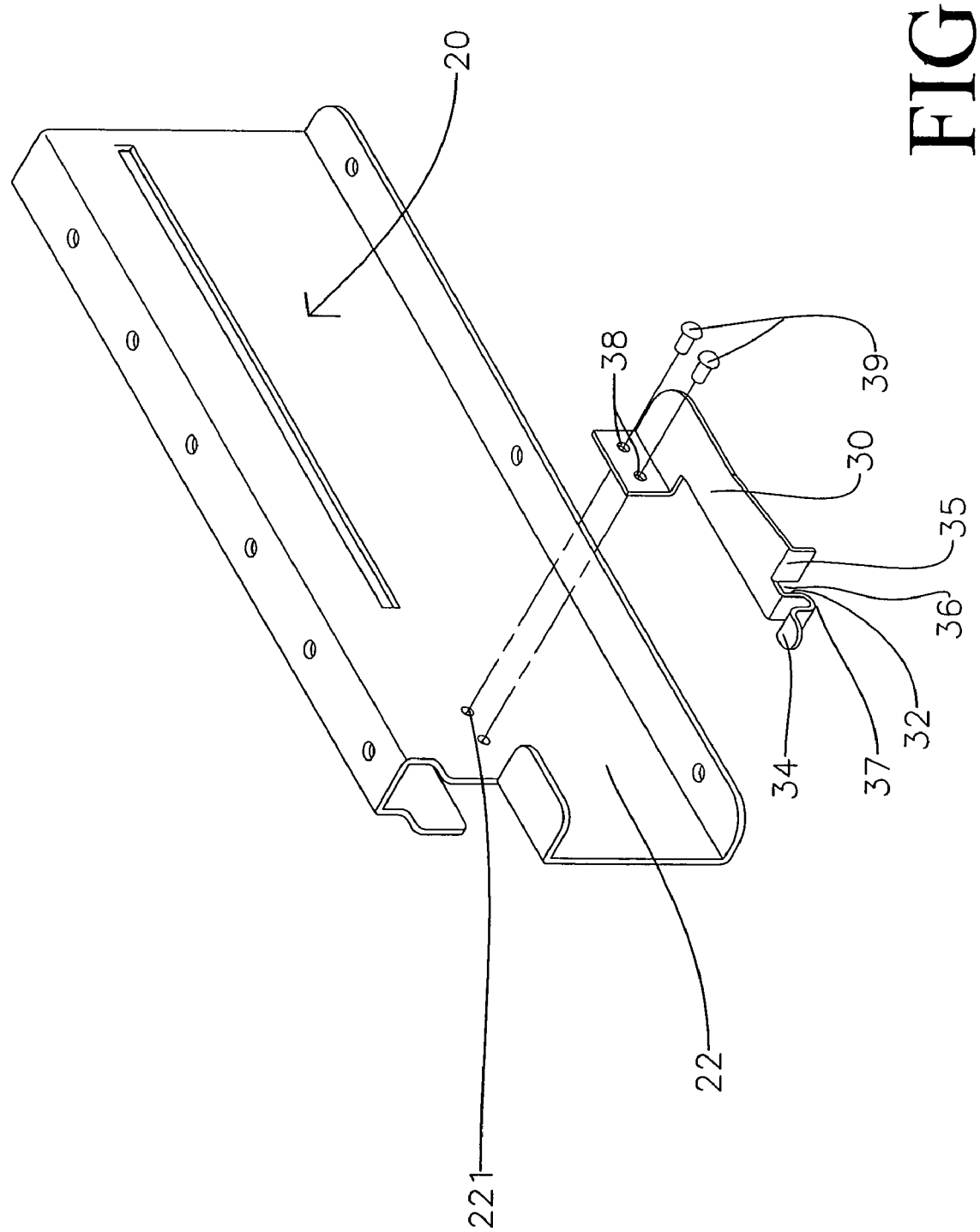
FIG. 2 shows an exploded elevational view of the protruding beam according to the present invention.
Figure 3:
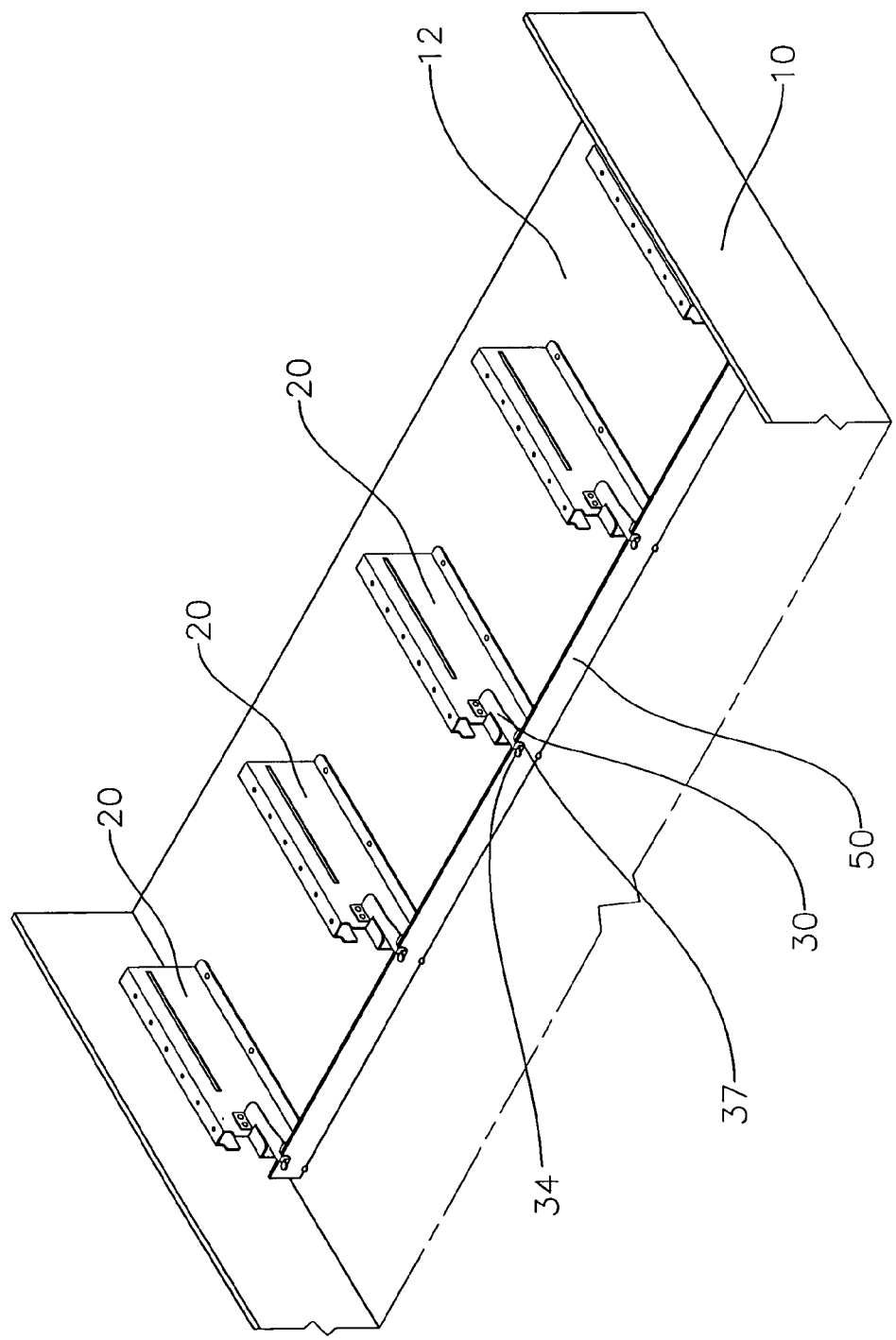
FIG. 3 shows an elevational view of a circuit board assembled and secured to a base panel using the protruding beams of the present invention.

Referring to FIGS. 1, 2 and 3, which show the circuit board securing device for a computer case of the present invention, comprising a computer case 10, on a base panel 12 of which are separately disposed vertical protruding beams 20. An elastic leaf 30 is affixed to a side wall surface 22 of each of the protruding beams 20. An end portion of each of the elastic leaves 30 forms a vertical top abutting wall 32, a front portion of which is configured with a raising member 34. A rear abutting wall 35 is formed on a side of the top abutting wall 32, and a clamping groove 36 is formed between the top abutting wall 32 and the rear abutting wall 35. Protruding holding bodies 40, between which are defined securing grooves 42, are formed on the base panel 12, and an opening of each of the securing grooves 42 corresponds to an opening of each of the clamping grooves 36 vertically above thereof.

According to the aforementioned primary characteristics of the elastic leaf 30, a U-shaped body 37 is formed between the top abutting wall 32 and the raising member 34.

According to the aforementioned primary characteristics, through holes 38 are defined in a rear side wall of the elastic leaf 30, and rivets 39 penetrate the through holes 38 to rivet into through holes 221 defined in the side wall surface 22 of the protruding beam 20.

According to the aforementioned primary characteristics, the elastic leaf 30 is raised by applying an upward force on the raising member 34, thereby enabling a circuit board 50 to pass through, whereafter a bottom end of the circuit board 50 can be snapped into the securing grooves 42, and a top end 54 can be clamped into the clamping grooves 35.

Referring to FIG. 3, which shows a computer case 10, on a base panel 12 of which is affixed at least two vertical protruding beams 20. A rear side of an elastic leaf 30 of each of the protruding beams 20 is affixed to a side wall surface 22 of each of the protruding beams 20, thereby forming elastic cantilevers that increase elasticity and flexibility of the elastic leaves 30. Referring to FIG. 5, a finger is used to pull up on a raising member 34, thereby causing the raising member 34 to form an angle that deforms the elastic leaf 30, whereupon a bottom end 52 of a circuit board 50 can be snapped into the securing groove 42. The long circuit board 50 is then supported in a vertical position with the hands, and an upward force applied to pull up and raise the elastic leaf 30 is released to enable the elastic leaf 30 to flexibly return to its original position, thereby enabling a top end 54 of the circuit board 50 to be clamped precisely into clamping grooves 36 (see FIG. 4). Referring to FIG. 3, the clamping grooves 36 of the elastic leaves 30 on a plurality of the protruding beams 20 are clamped onto the top end 54 of the circuit board 50 one after another, and a plurality of the securing grooves 42 are securely clamped onto the bottom end 52 of the circuit board 50 one after another, thereby effectively securing the long circuit board 50 onto the base panel 12.

Referring to FIG. 5, a force is applied to the raising members 34 to upwardly raise the elastic leaves 30, and, similar to the action mentioned above, the top end 54 of the circuit board 50 is able to be separated from the clamping grooves 36, and the bottom end 52 of the circuit board 50 is able to be separated from the securing grooves 42, thereby enabling the circuit board 50 to be smoothly taken out, whereupon the elastic leaves 30 return to their original position.

Figure 4:
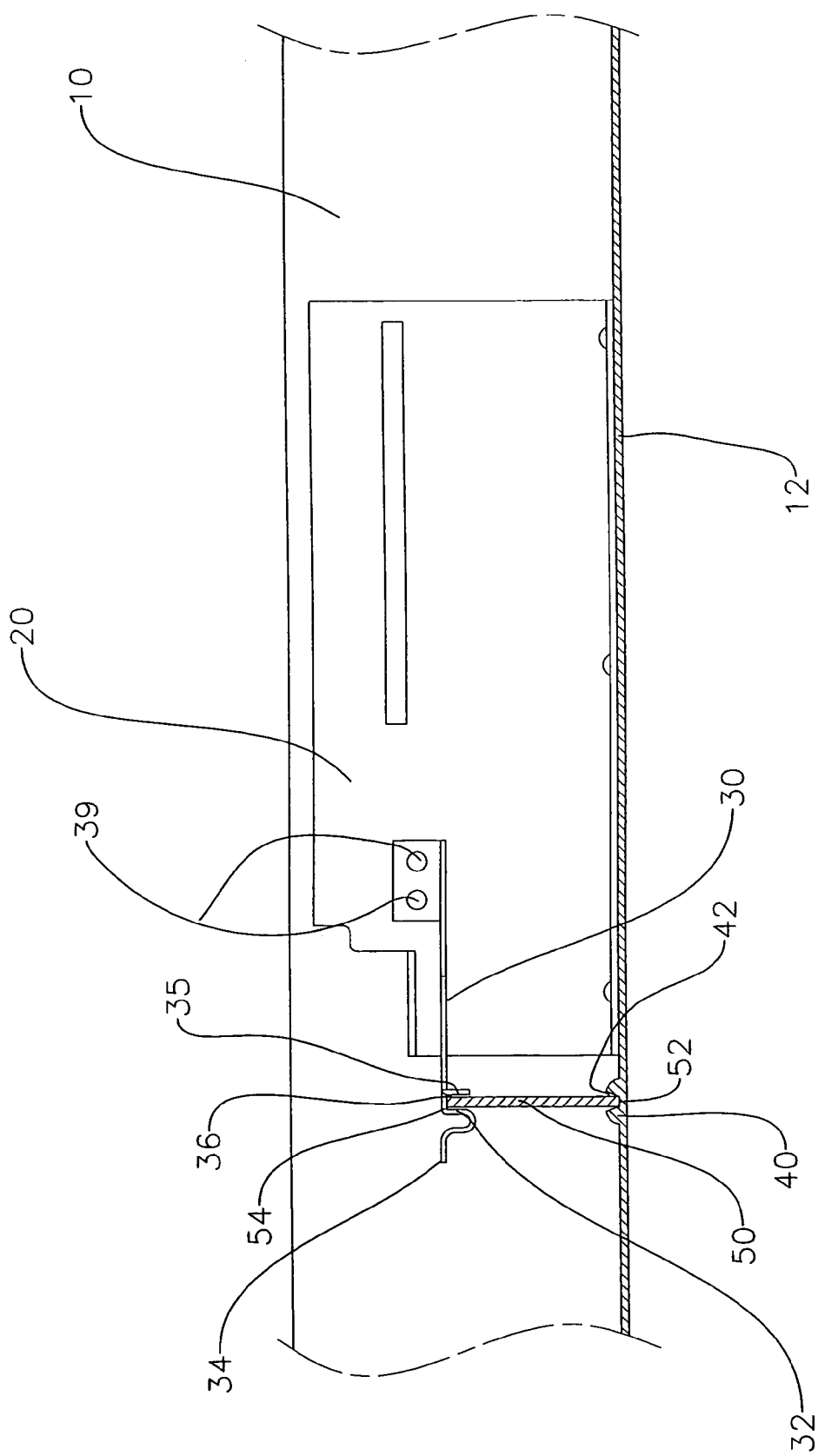
FIG. 4 shows a cross-sectional view of a circuit board secured with the protruding beams according to the present invention.
Figure 5:
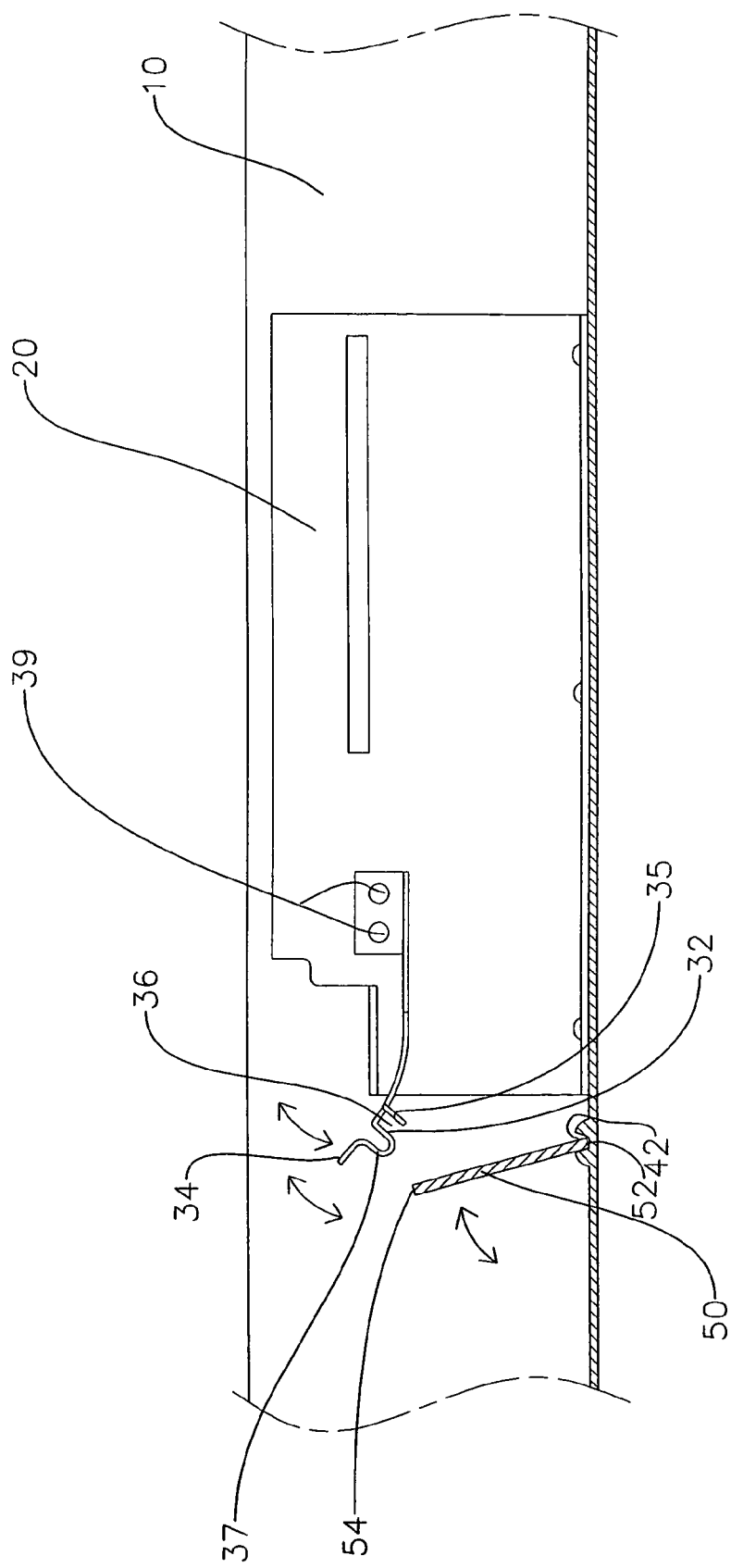
FIG. 5 shows a cross-sectional view of a circuit board being taken out according to the present invention.

Referring to FIGS. 1 and 4, a U-shaped body formed on each of the elastic leaves 30 is designed to increase strength of thrust, which enables the top abutting wall 32 to more effectively abut against a side wall surface of the circuit board 50, and enables the rear abutting wall 35 to abut against an inner side wall surface of the circuit board 50, thereby effectively securing the circuit board 50.

Referring to FIG. 4, diameter of the groove opening of each of the securing grooves 42 is relatively large, thereby enabling the bottom end 52 of the circuit board 50 to be conveniently snapped into or separated from the securing grooves 42.

In conclusion, the present invention not only eliminates the need for screws to secure the circuit board 50 to a base panel 12 of a computer case 10, but is also extremely convenient to assemble and disassemble, and is provided with substantial originality and advancement. Accordingly, a new patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A circuit board securing device for computer case, comprising:

a computer case, on a base panel of which are separately disposed vertical protruding beams, an elastic leaf is affixed to a side wall surface of each of the protruding beams, an end portion of each of the elastic leaves forms a vertical top abutting wall, a front portion of which is configured with a raising member, a rear abutting wall is formed on a side of the top abutting wall, and a clamping groove is formed between the top abutting wall and the rear abutting wall, protruding holding bodies, between which are defined securing grooves, are formed on the base panel, and an opening of each of the securing grooves corresponds to an opening of each of the clamping grooves.

2. The circuit board securing device for computer case according to claim 1, wherein a U-shaped body is formed between the top abutting wall and the raising member.

3. The circuit board securing device for computer case according to claim 1, wherein through holes are defined in a rear side wall of the elastic leaf, and rivets penetrate the through holes to rivet into through holes defined in the side wall surface of the protruding beam.

4. The circuit board securing device for computer case according to claim 1, wherein the elastic leaf is raised by applying an upward force on the raising member, thereby enabling the circuit board to pass through, whereafter a bottom end of the circuit board is snapped into the securing grooves, and a top end is clamped into the clamping grooves.

* * * * *